US 6,571,377 B2

(12) United States Patent
Narita

(10) Patent No.: US 6,571,377 B2
(45) Date of Patent: May 27, 2003

(54) CIRCUIT DESIGN APPARATUS AND METHOD THEREOF FOR OPTIMIZING A CIRCUIT

(75) Inventor: Hiroki Narita, Tokyo (JP)

(73) Assignee: NEC Corporation, Tokyo (JP)

(*) Notice: Subject to any disclaimer, the term of this patent is extended or adjusted under 35 U.S.C. 154(b) by 72 days.

(21) Appl. No.: 09/796,798

(22) Filed: Mar. 2, 2001

(65) Prior Publication Data

US 2001/0021991 A1 Sep. 13, 2001

(30) Foreign Application Priority Data

Mar. 7, 2000 (JP) .................................. 2000-062312

(51) Int. Cl.[7] ................................................. G06F 17/50
(52) U.S. Cl. .................................................... 716/7
(58) Field of Search ........................ 716/2, 7, 11, 12

(56) References Cited

U.S. PATENT DOCUMENTS 6,263,478 B1 * 7/2001 Hahn et al. .................. 716/10
6,430,726 B1 * 8/2002 Nakamura ..................... 716/2

* cited by examiner

*Primary Examiner*—Matthew Smith
*Assistant Examiner*—Thuan Do
(74) *Attorney, Agent, or Firm*—Sughrue Mion, PLLC

(57) ABSTRACT

A circuit design apparatus of the present invention includes a first element which divides a circuit into a plurality of divided circuits and a second element which calculates individual constraint values of the divided circuits, respectively, using a constraint value of the circuit. A third element of the present invention optimizes each of the divided circuits based on the corresponding individual constraint values. A fourth element merges the divided circuits, which are optimized by the third element, into one circuit.

27 Claims, 11 Drawing Sheets

| DIVIDED CIRCUIT 111: DIVIDED CIRCUIT 112=5 NANOSECONDS :5 NANOSECONDS = 1:1 | DIVIDED CIRCUIT 111 → 5.0 NANOSECONDS |
|---|---|
| | DIVIDED CIRCUIT 112 → 5.0 NANOSECONDS |
| DIVIDED CIRCUIT 111: DIVIDED CIRCUIT 114=5 NANOSECONDS :10 NANOSECONDS = 1:2 | DIVIDED CIRCUIT 111 → 3.3 NANOSECONDS |
| | DIVIDED CIRCUIT 114 → 6.7 NANOSECONDS |
| DIVIDED CIRCUIT 113: DIVIDED CIRCUIT 112=10 NANOSECONDS :5 NANOSECONDS = 2:1 | DIVIDED CIRCUIT 113 → 6.7 NANOSECONDS |
| | DIVIDED CIRCUIT 112 → 3.3 NANOSECONDS |
| DIVIDED CIRCUIT 113: DIVIDED CIRCUIT 114=5 NANOSECONDS :5 NANOSECONDS = 1:1 | DIVIDED CIRCUIT 113 → 5.0 NANOSECONDS |
| | DIVIDED CIRCUIT 114 → 5.0 NANOSECONDS |

Fig.4a

| |
|---|
| DIVIDED CIRCUIT 111 → 3.3 NANOSECONDS |
| DIVIDED CIRCUIT 112 → 3.3 NANOSECONDS |
| DIVIDED CIRCUIT 113 → 5.0 NANOSECONDS |
| DIVIDED CIRCUIT 114 → 5.0 NANOSECONDS |

CIRCUIT DESIGN APPARATUS AND METHOD THEREOF FOR OPTIMIZING A CIRCUIT

BACKGROUND OF THE INVENTION

1. Field of the Invention

The present invention relates to a circuit design apparatus and a circuit design method, and more particularly to a circuit design apparatus and a circuit design method for optimizing a circuit.

2. Description of the Related Art

Conventionally, a circuit design apparatus and a circuit design method perform the logic optimization of a whole logic circuit (hereinafter called a first prior art). In the conventional logic optimization method, the whole logic circuit is manually divided into a plurality of sub-blocks and then logic optimization is performed for each sub-block (hereinafter called a second prior art).

A problem with the first prior art is that it takes long. Another problem with the first prior art is that optimization is performed in one process because a circuit is not divided into a plurality of sub-blocks.

A problem with the second prior art is that dividing a circuit into sub-blocks requires manpower. Another problem is that a target value must be set up separately for the optimization of each sub-block.

SUMMARY OF THE INVENTION

It is an object of the present invention to provide a circuit design apparatus and a circuit design method for automatically dividing a circuit to generate divided circuits.

It is another object of the present invention to provide a circuit design apparatus and a circuit design method for optimizing a circuit quickly.

According to one aspect of the present invention, a circuit design apparatus is provided which includes: a first element which divides a circuit into a plurality of divided circuits; a second element which calculates individual constraint values of the divided circuits, respectively, using a constraint value of the circuit; a third element which optimizes each of the divided circuits based on the corresponding individual constraint values; and a fourth element which merges the divided circuits, which are optimized by the third element, into one circuit.

According to another aspect of the present invention, a circuit design apparatus is provided which includes: a first element which generates a plurality of divided circuits from a circuit; a second element which selects a longest-delay-time combination out of combinations each composing of interconnected divided circuits included in the circuit, and calculates individual constraint values of the divided circuits of the selected combination using a constraint value of the circuit; a third element which optimizes the divided circuits, for which the constraint values are calculated by the second element, based on the individual constraint values; and a fourth element which merges the divided circuits optimized by the third element with the divided circuits generated by the first element but not included in the combination selected by the second element to generate one circuit.

According to another aspect of the present invention, a circuit design method is provided which includes: dividing a circuit into a plurality of divided circuits; calculating individual constraint values of the divided circuits, respectively, using a constraint value of the circuit; optimizing each of the divided circuits based on the corresponding individual constraint values; and merging the divided circuits, which are optimized during the optimizing step, into one circuit.

According to another aspect of the present invention, a circuit design method is provided which includes: generating a plurality of divided circuits from a circuit; selecting a longest-delay-time combination out of combinations each composing of interconnected divided circuits included in the circuit; calculating individual constraint values of the divided circuits of the selected combination using a constraint value of the circuit; optimizing the divided circuits, for which the constraint values are calculated, based on the individual constraint values; and merging the divided circuits included in the circuit but not in the combination selected during the selecting step with the divided circuits optimized during the optimizing step to generate one circuit.

BRIEF DESCRIPTION OF THE DRAWINGS

Other features and advantages of the invention will be made more apparent by the following detailed description and the accompanying drawings, wherein:

FIGS. 4a and 4b are a diagram showing constraint values given to the divided circuits;

In the drawings, the same reference numerals represent the same structural elements.

DETAILED DESCRIPTION OF THE PREFERRED EMBODIMENTS

A first embodiment of the present invention will be described in detail below.

Figure 1:
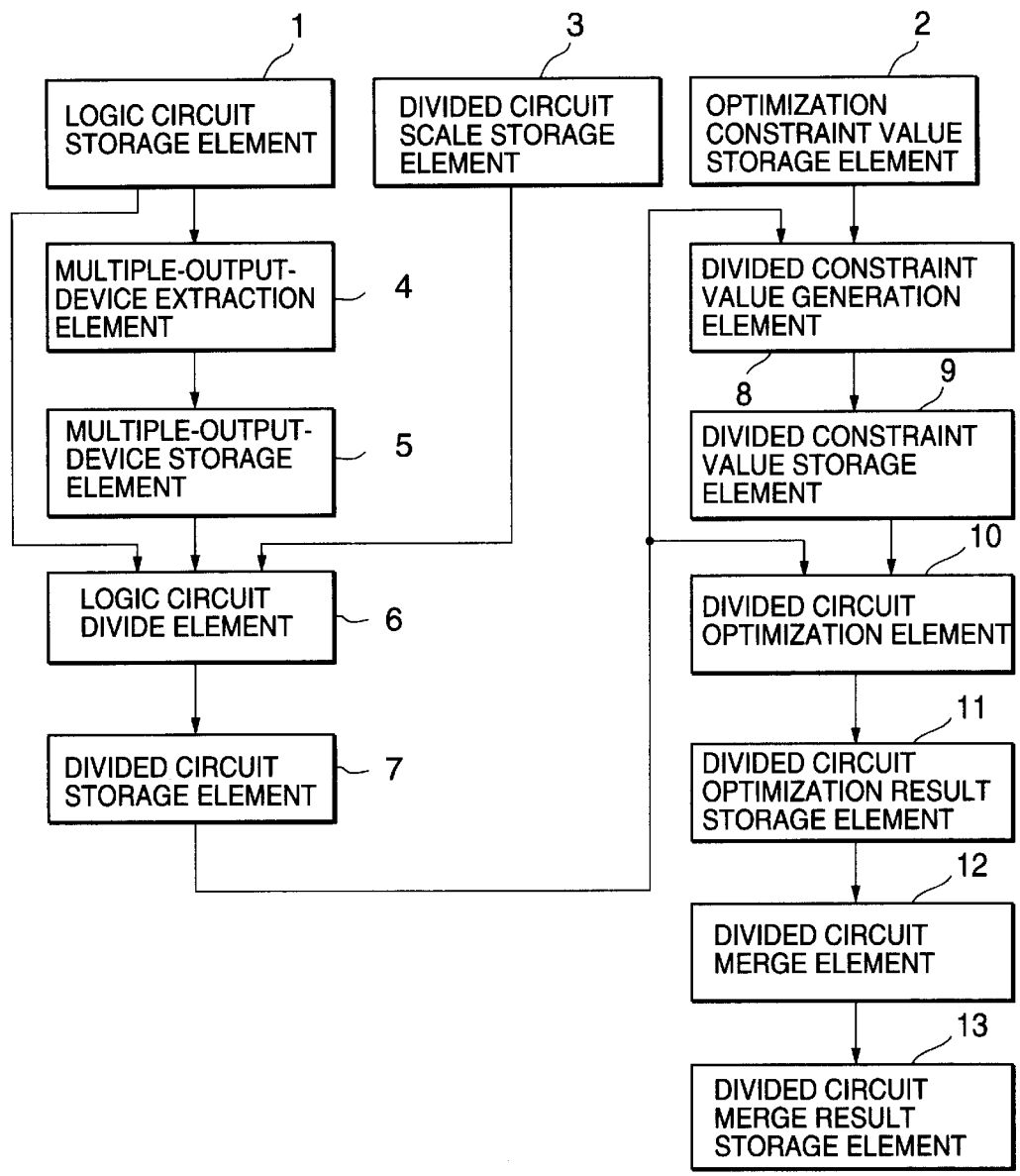
FIG. 1 is a block diagram showing a first embodiment of the present invention.

Referring to FIG. 1, a circuit design apparatus according to the present invention comprises a logic circuit storage element 1, an optimization constraint value storage element 2, a divided circuit scale storage element 3, a multiple-output-device extraction element 4, a multiple-output-device storage element 5, a logic circuit dividing element 6, a divided circuit storage element 7, a divided constraint value generation element 8, a divided constraint value storage element 9, a divided circuit optimization element 10, a divided circuit optimization result storage element 11, a divided circuit merge element 12, and a divided circuit merge result storage element 13.

Figure 2:
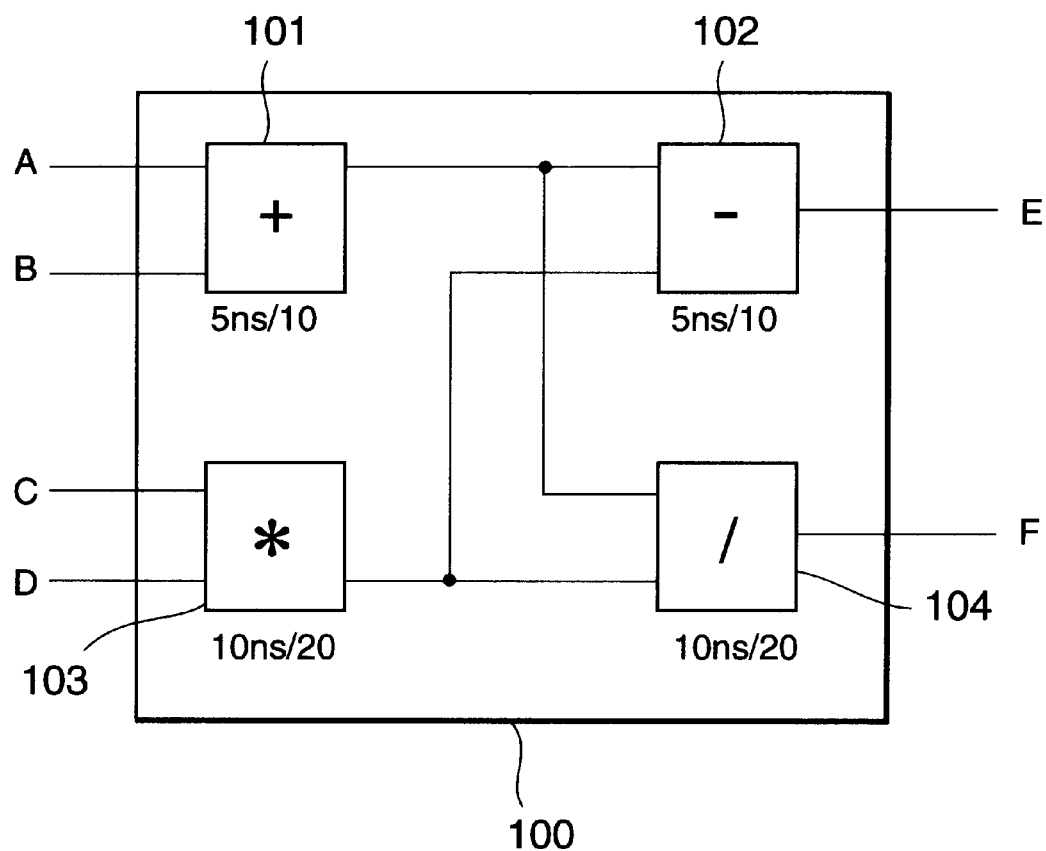
FIG. 2 is a diagram showing a logic circuit 100.

The logic circuit storage element 1 contains circuit information on a logic circuit to be optimized. This information is represented as a circuit diagram or in hardware description language. For example, as shown in FIG. 2, the logic circuit storage element 1 contains information on a logic circuit 100 comprising a logic device 101 (delay value: 5.0 nanoseconds, scale: 10), a logic device 102 (delay value: 5.0 nanoseconds, scale: 10), a logic device 103 (delay value: 10 nanoseconds, scale: 20), and a logic device 104 (delay value: 10 nanoseconds, scale: 20). In the logic circuit 100, the output signal from the logic device 101 is input to the logic devices 102 and 104. The scale is the area of a logic device. The output signal from the logic device 103 is input to the logic devices 102 and 104.

The optimization constraint value storage element 2 contains a constraint value used for the logic optimization of the logic circuit whose information is stored in the logic circuit storage element 1. The constraint value is, for example, a delay limit value. The constraint value is defined for each logic circuit. In this embodiment, the optimization constraint value storage element 2 contains the value of 10 nanoseconds as the constraint value of the logic circuit 100.

The divided circuit scale storage element 3 contains the minimum scale value of a divided circuit. The minimum scale value is used to check if a divided circuit generated as a result of dividing satisfies a predetermined scale. The divided circuit scale storage element 3 contains, for example, a scale value of 1.

The multiple-output-device extraction element 4 selects one or more logic devices, from which the output signal is connected to a plurality of other logic devices, from a logic circuit whose information is stored in the logic circuit storage element 1. The element then stores the circuit information on the selected logic devices into the multiple-output-device storage element 5. In the case of the logic circuit 100, the multiple-output-device extraction element 4 selects the logic devices 101 and 103.

The multiple-output-device storage element 5 contains information on the logic devices extracted by the multiple-output-device extraction element 4.

The logic circuit dividing element 6 gets information on the logic devices stored in the multiple-output-device storage element 5 and divides the logic circuit, whose information is stored in the logic circuit storage element 1, with the output signals of the logic devices as the cut points (cutting points).

The logic circuit dividing element 6 checks if the scale of a divided circuit exceeds a predetermined scale value based on the minimum scale value stored in the divided circuit scale storage element 3. If the scale of the divided circuit is smaller than the predetermined scale, the logic circuit dividing element 6 does not use the logic device as the cut point. If the divided circuit exceeds the predetermined scale, the logic circuit dividing element 6 stores the divided circuit in the divided circuit storage element 7.

Figure 3:
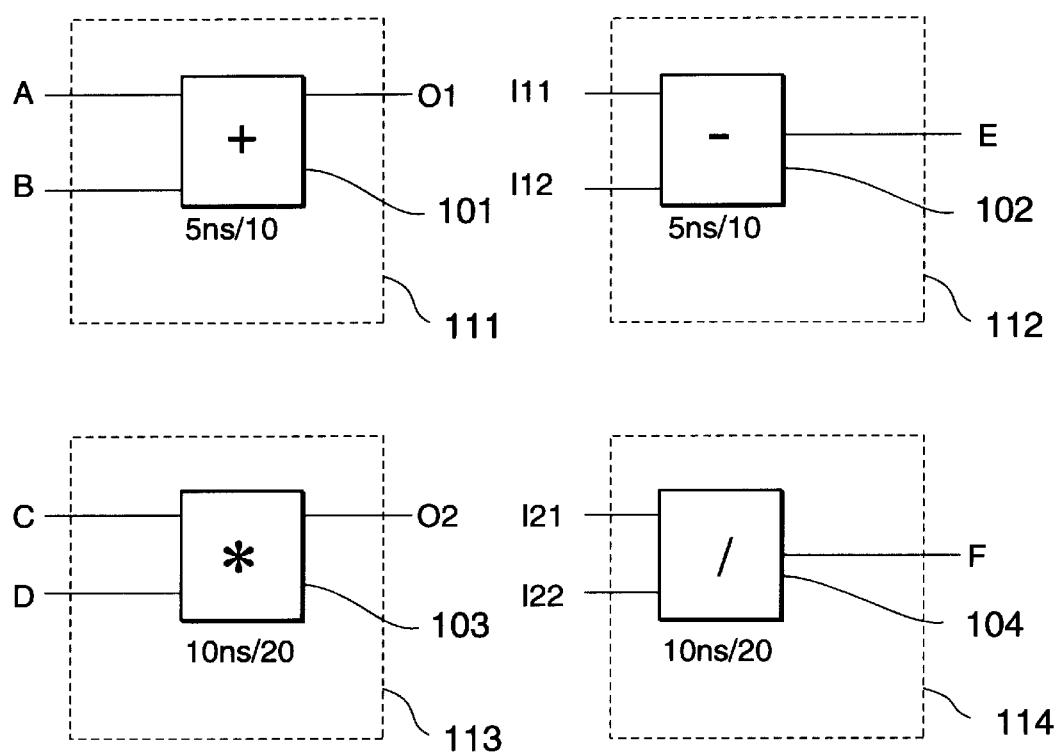
FIG. 3 is a diagram showing divided circuits 111, 112, 113, and 114.

Referring to FIG. 3, the logic circuit dividing element 6 divides the logic circuit 100, whose information is stored in the logic circuit storage element 1, into four circuits with the output signals of the logic devices 101 and 103 in the multiple-output-device storage element 5 as the cut point. The four circuits are a divided circuit 111 having the logic device 101, a divided circuit 112 having the logic device 102, a divided circuit 113 having the logic device 103, and a divided circuit 114 having the logic device 104. The logic circuit dividing element 6 finds that the circuit scale of the divided circuits 111, 112, 113, and 114 satisfy the minimum scale value of 1, it stores the divided circuits 111, 112, 113, and 114 into the divided circuit storage element 7.

The divided constraint value generation element 8 finds the constraint values of the divided circuits, as shown in FIG. 4, based on the connection relation of the plurality of divided circuits. More specifically, the divided constraint value generation element 8 calculates the delay value ratio of each two interconnected divided circuits stored in the divided circuit storage element 7. And, it generates the constraint values of the divided circuits based on the value stored in the optimization constraint value storage element 2 (this value applies to the whole logic circuit 100 from its entry point to the exit point) according to the calculated delay value ratios. Then element then stores the generated constraint values in the divided constraint value storage element 9. The divided constraint value generation element 8 allocates the constraint value of 10 nanoseconds, stored in the optimization constraint value storage element 2, to each connection of the divided circuits, stored in the divided circuit storage element 7, according to the delay time ratio. Then, it stores the allocated delay values of the divided circuits into the divided constraint value storage element 9 as the constraint values of the divided circuits.

The divided circuit optimization element 10 performs the logic optimization, in parallel, for the plurality of divided circuits stored in the divided circuit storage element 7 using the constraint values of the divided circuits stored in the divided constraint value storage element 9. It then stores the optimized results in the divided circuit optimization result storage element 11. For each divided circuit, conventional optimization processing may be performed.

The divided circuit merge element 12 merges a plurality of divided circuits stored in the divided circuit optimization result storage element 11 into one logic circuit and stores the merged circuit into the divided circuit merge result storage element 13. The logic circuit stored in the divided circuit merge element 12 is an optimized logic circuit.

Next, the operation of the embodiment will be described.

In this embodiment, the logic circuit 100 shown in FIG. 2 will be described.

The logic circuit storage element 1 contains the logic circuit information on the logic circuit 100.

The optimization constraint value storage element 2 contains a delay limit value of 10 nanoseconds that is used for the logic optimization of the logic circuit 100 whose information is stored in the logic circuit storage element 1. The divided circuit scale storage element 3 contains the minimum scale value of 1 of a divided circuit.

Figure 5:
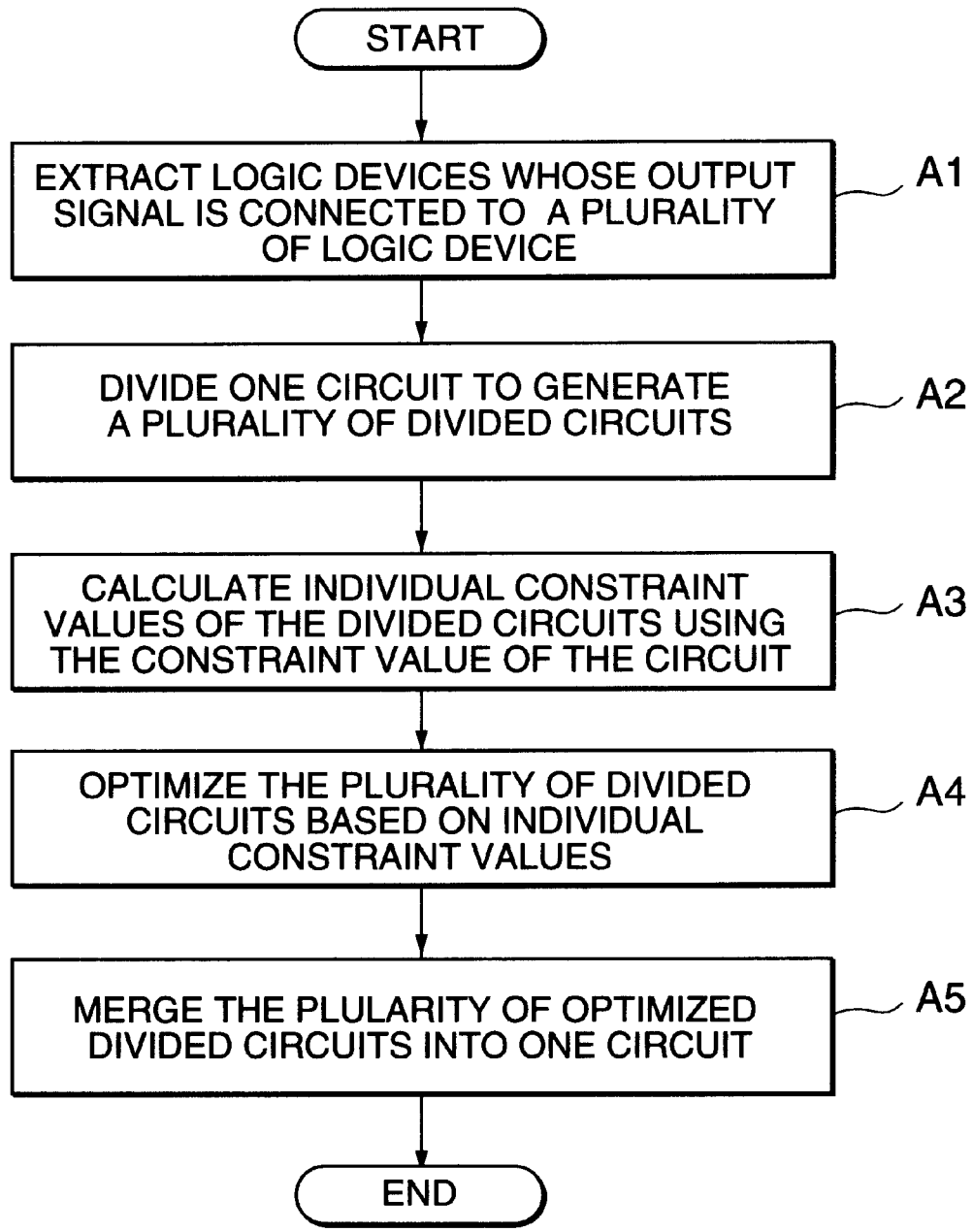
FIG. 5 is a flowchart showing the first embodiment of the present invention.

Referring to FIGS. 1 and 5, the multiple-output-device extraction element 4 uses the circuit information on the logic circuit 100, stored in the logic circuit storage element 1, to extract the logic devices 101 and 103, whose output signal is connected to a plurality of logic devices, from the logic circuit 100 (step A1). The multiple-output-device extraction element 4 stores the extracted logic devices in the multiple-output-device storage element 5.

The logic circuit dividing element 6 divides one circuit into a plurality of divided circuits (step A2). More specifically, the logic circuit dividing element 6 divides the logic circuit 100, whose information is stored in the logic circuit storage element 1, into the divided circuits 111, 112, 113, and 114, as shown in FIG. 3. In this case, the element uses the output signals of the logic devices 10 and 103, extracted by the multiple-output-device extraction element 4 and stored in the multiple-output-device storage element 5, as the cut points. Because the circuit scale of the divided circuits 111, 112, 113, and 114 is equal to or larger than the circuit scale value of 1 stored in the divided circuit scale storage element 3, the logic circuit dividing element 6 stores the divided circuits 111, 112, 113, and 114 into the divided circuit storage element 7. When dividing the logic circuit 100, the logic circuit dividing element 6 adds pin name information to the new pins generated as a result of dividing. The generated new pins are O1 of the divided circuit 111, O2 of divided circuit 113, I11 and I12 of the divided circuit 112, and I21 and I22 of the divided circuit 114. More specifically, pin name information (divided circuit 112/I11, divided circuit 114/I21) is added to the output terminal O1 of the divided circuit 111. Pin name information (divided circuit 112/I12, divided circuit 114/I22) is added to the output terminal O2 of the divided circuit 113. Pin name information (divided circuit 111/O1) is added to the input terminal I11 of the divided circuit 112.

Pin name information (divided circuit 113/O2) is added to the input terminal I12 of the divided circuit 112. Pin name information (divided circuit 111/O1) is added to the input terminal I21 of the divided circuit 114. Pin name information (divided circuit 113/O2) is added to the input terminal I22 of the divided circuit 114.

The divided constraint value generation element 8 calculates the constraint value of each of the plurality of divided circuits using the constraint value of the circuit (step A3). The following details the operation. As shown in FIG. 4, the divided constraint value generation element 8 calculates the delay value ratio for each connection relation of divided circuits stored in the divided circuit storage element 7, that is, (divided circuit 111–divided circuit 112), (divided circuit 111–divided circuit 114) (divided circuit 113–divided circuit 112), and (divided circuit 113–divided circuit 114). More specifically, because the delay time of the divided circuit 111 is 5.0 nanoseconds and the delay time of the divided circuit 112 is 5.0 nanoseconds, the constraint value ratio between the divided circuit 111 and the divided circuit 112 is 5.0 nanoseconds:5.0 nanoseconds, that is, 1:1. Because the delay time of the divided circuit 111 is 5.0 nanoseconds and the delay time of the divided circuit 114 is 10 nanoseconds, the constraint value ratio between the divided circuit 111 and the divided circuit 114 is 5.0 nanoseconds:10 nanoseconds, that is, 1:2. Because the delay time of the divided circuit 113 is 10 nanoseconds and the delay time of the divided circuit 112 is 5.0 nanoseconds, the constraint value ratio between the divided circuit 113 and the divided circuit 112 is 10 nanoseconds:5.0 nanoseconds, that is, 2:1. Because the delay time of the divided circuit 113 is 10 nanoseconds and the delay time of the divided circuit 114 is 10 nanoseconds, the constraint value ratio between the divided circuit 113 and the divided circuit 114 is 10 nanoseconds:10 nanoseconds, that is, 1:1. The divided constraint value generation element 8 distributes the constraint value of 10 nanoseconds, stored in the optimization constraint value storage element 2, among the divided circuits according to the constraint value ratio. The connection relation (divided circuit 111–divided circuit 112) gives the divided circuit 111 the constraint value of 5.0 nanoseconds, and the divided circuit 112 the constraint value of 5.0 nanoseconds. The connection relation (divided circuit 111–the divided circuit 114) gives the divided circuit 111 the constraint value of 3.3 nanoseconds, and the divided circuit 114 the constraint value of 6.7 nanoseconds. The connection relation (divided circuit 113–divided circuit 112) gives the divided circuit 113 the constraint value of 6.7 nanoseconds, and the divided circuit 112 the constraint value of 3.3 nanoseconds. The connection relation (divided circuit 113—divided circuit 114) gives the divided circuit 113 the constraint value of 5.0 nanoseconds, and the divided circuit 114 the constraint value of 5.0 nanoseconds. For each divided circuit, the divided constraint value generation element 8 selects the rigorous from the plurality of constraint values to generate the constraint value of the divided circuit. In this embodiment, the shortest delay time is selected. The divided constraint value generation element 8 selects the constraint value of 3.3 nanoseconds for the divided circuit 111, the constraint value of 3.3 nanoseconds for the divided circuit 112, the constraint value of 5.0 nanoseconds for the divided circuit 113, and the constraint value of 5.0 nanoseconds for the divided circuit 114. The element then stores these values in the divided constraint value storage element 9.

More specifically, for the constraint value of the divided circuit 111, the value of 5.0 nanoseconds is obtained from the relation between the divided circuit 111 and the divided circuit 112, and the value of 3.3 nanoseconds from the relation between the divided circuit 11 and the divided circuit 114. From these two values, the divided constraint value generation element 8 generates the constraint value of 3.3 nanoseconds for the divided circuit 111. For the constraint value of the divided circuit 112, the divided constraint value generation element 8 selects 3.3 nanoseconds from two values, 5.0 nanoseconds and 3.3 nanoseconds, and generates the constraint value of 3.3 nanoseconds. For the constraint value of the divided circuit 113, 6.7 nanoseconds and 5.0 nanoseconds are obtained, respectively, from the relation between the divided circuits 113 and 112 and the relation between the divided circuits 113 and 114. The divided constraint value generation element 8 selects 5.0 nanoseconds to generate the constraint value of the divided circuit 113. The divided constraint value generation element 8 compares 6.7 seconds obtained from the relation between the divided circuit 114 and the divided circuit 111 with 5.0 nanoseconds obtained from the relation between the divided circuit 114 and the divided circuit 113. The divided constraint value generation element 8 generates the constraint value of 5.0 nanoseconds for the divided circuit 114.

Figure 6:
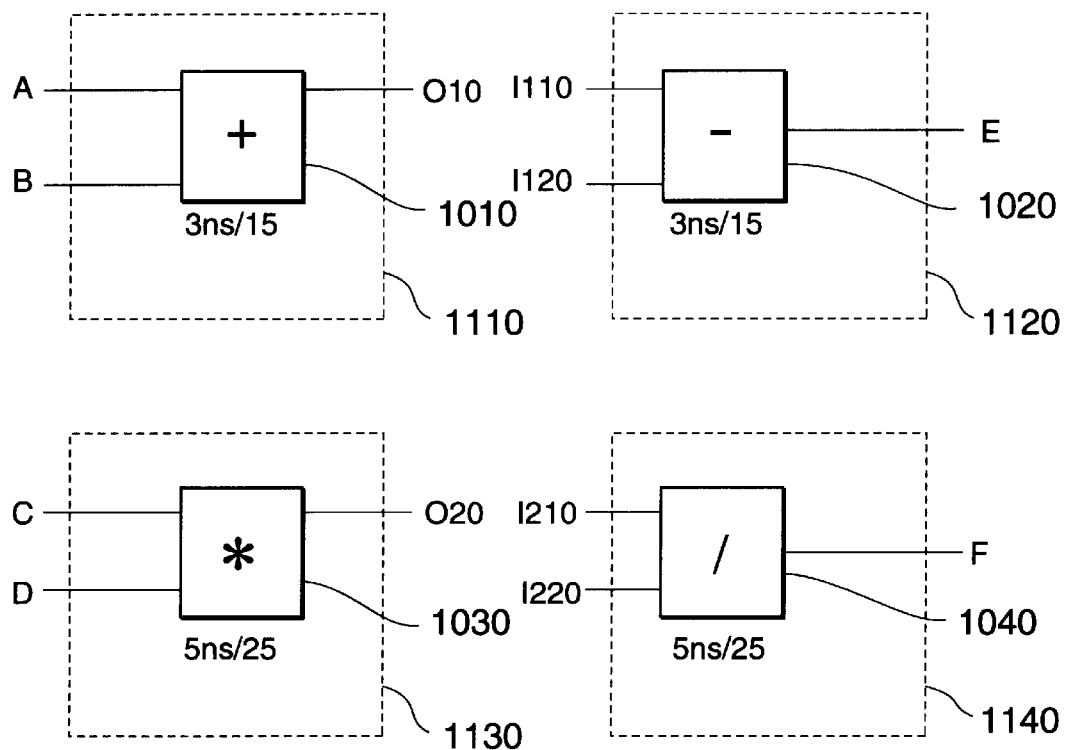
FIG. 6 is a diagram showing optimized divided circuits 1110, 1120, 1130, and 1140.

The divided circuit optimization element 10 optimizes each of the plurality of divided circuits based on the constraint value (step A4). More specifically, the divided circuit optimization element 10 performs parallel logic optimization for the divided circuits 111, 112, 113, and 114 stored in the divided circuit storage element 7 using the constraint values stored in the divided constraint value storage element 9. The constraint values are 3.3 nanoseconds for the divided circuit 111, 3.3 nanoseconds for the divided circuit 112, 5.0 nanoseconds for the divided circuit 113, and 5.0 nanoseconds for the divided circuit 114. The divided circuit optimization element 10 stores the optimization result shown in FIG. 6, that is, a divided circuit 1110, a divided circuit 1120, a divided circuit 1130, and a divided circuit 1140, into the divided circuit optimization result storage element 11.

Figure 7:
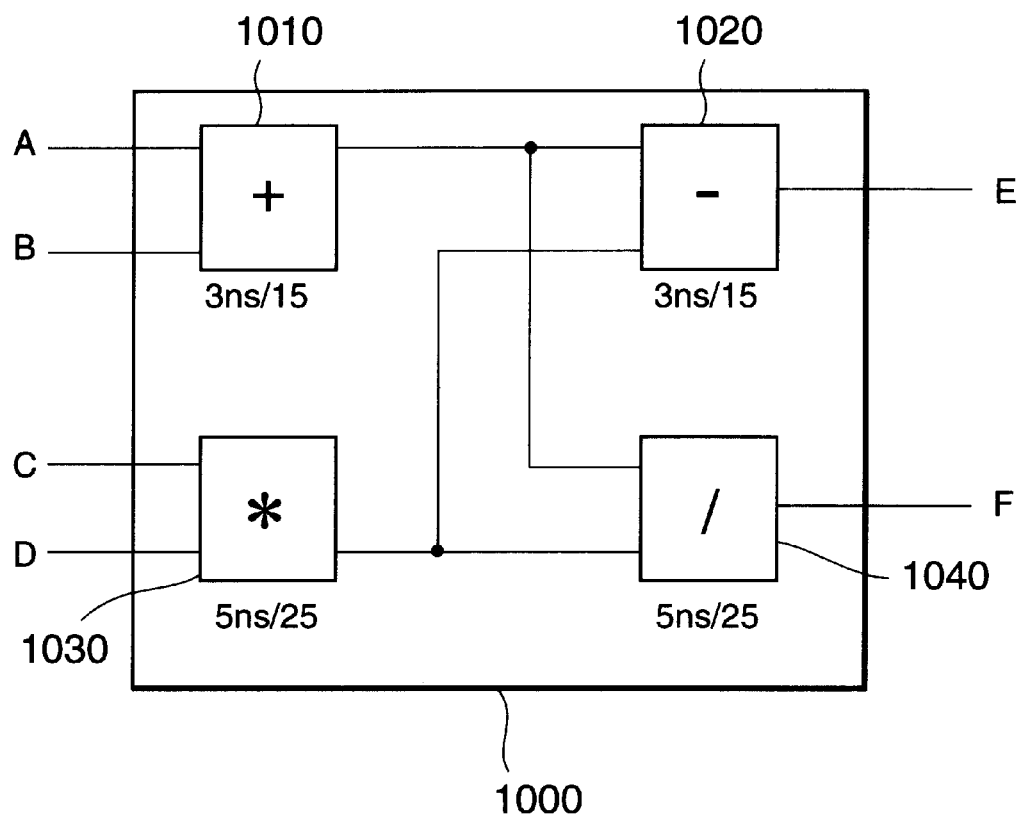
FIG. 7 is a diagram showing a logic circuit 1000.

The divided circuit merge element 12 merges the plurality of optimized divided circuits into one circuit (step A5). More specifically, the divided circuit merge element 12 references the divided circuit optimization result storage element 11 to get information on the input/output terminals. The terminals are the output signal terminal O10 of the divided circuit 1110, the input signal terminals I110 and I120 of the divided circuit 1120, the output signal terminal O20 of the divided circuit 1130, and the input signal terminals I210 and I220 of the divided circuit 1140. Then, the divided circuit merge element 12 connects the output signal terminal O10 of the divided circuit 1110 to the input signal terminal I110 of the divided circuit 1120 and to the input signal terminal I210 of the divided circuit 1140 and connects the output signal terminal O20 of the divided circuit 1130 to the input signal terminal I120 of the divided circuit 1120 and to the input signal terminal I220 of the divided circuit 1140 to generate one logic circuit 1000. FIG. 7 shows the generated logic circuit 1000. The divided circuit merge element 12 stores the logic circuit 1000 into the divided circuit merge result storage element 13.

As described above, with the output signals of the logic devices 101 and 103 as cut points (these signals are connected to a plurality of logic devices), the apparatus in this embodiment divides the logic circuit 100 into a plurality of divided circuits, 111, 112, 113, and 114. After that, the apparatus performs logic optimization, in parallel, for each of these divided circuits. This means that the optimization of a logic circuit is changed automatically to the optimization of a plurality of circuits. Another advantage of the present invention is the quick optimization of the whole circuit achieved through parallel optimization.

Next, a second embodiment of the present invention will be described in detail.

Figure 8:
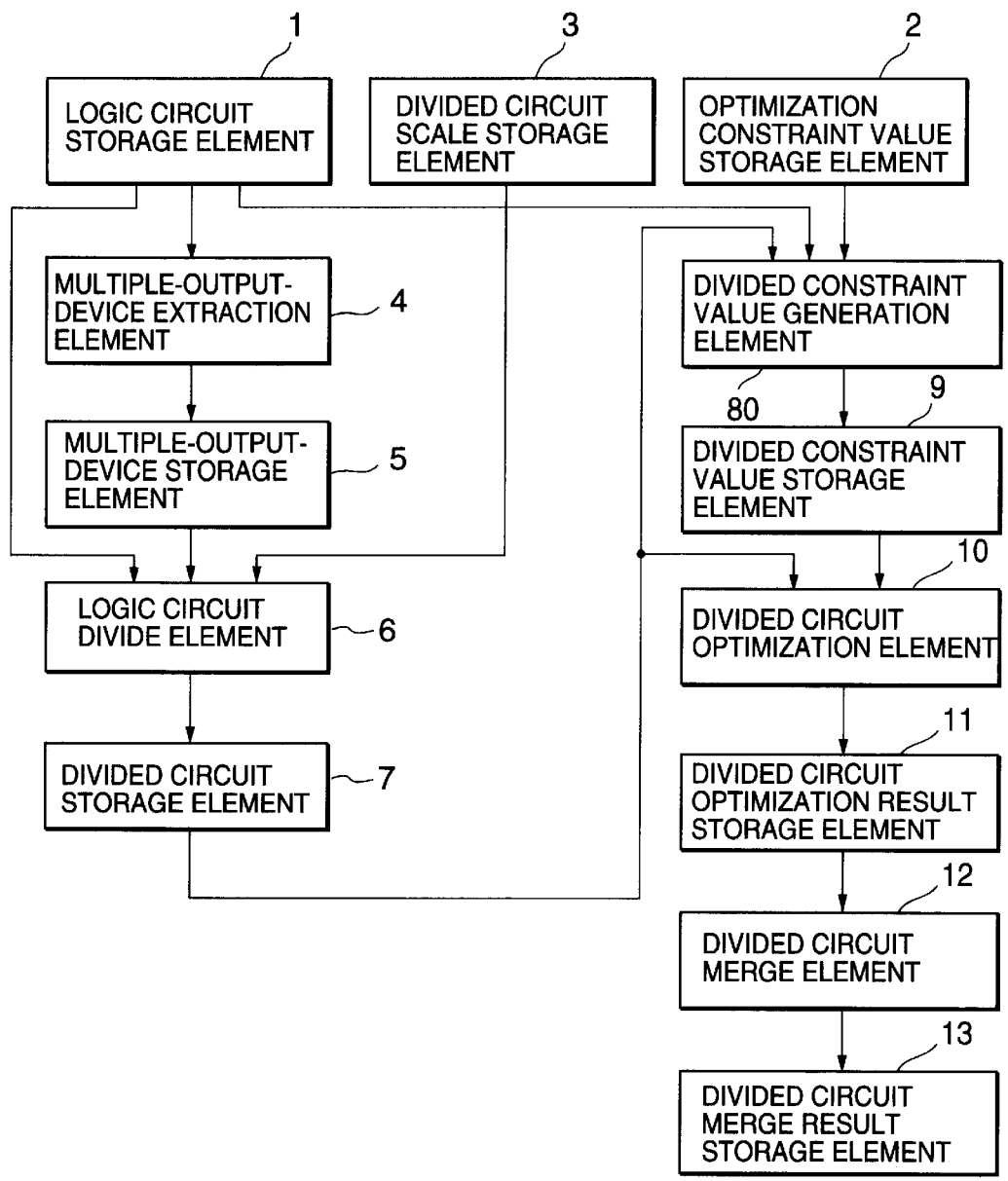
FIG. 8 is a block diagram showing a second embodiment of the present invention.

Referring to FIG. 8, a circuit design apparatus in the second embodiment comprises a logic circuit storage element 1, an optimization constraint value storage element 2, a divided circuit scale storage element 3, a multiple-output-device extraction element 4, a multiple-output-device storage element 5, a logic circuit dividing element 6, a divided circuit storage element 7, a divided constraint value generation element 80, a divided constraint value storage element 9, a divided circuit optimization element 10, a divided circuit optimization result storage element 11, a divided circuit merge element 12, and a divided circuit merge result storage element 13. The logic circuit storage element 1, optimization constraint value storage element 2, divided circuit scale storage element 3, multiple-output-device extraction element 4, multiple-output-device storage element 5, logic circuit dividing element 6, and divided circuit storage element 7 are similar in structure to those in FIG. 1.

The divided constraint value generation element 80 selects the longest-delay-time combination of logic device connections from the logic devices in the logic circuit whose information is stored in the logic circuit storage element 1, and calculates the delay time ratio between the divided circuits constituting the longest-delay-time combination. Based on the calculated ratio, the divided constraint value generation element 80 proportionally distributes the constraint value, stored in the optimization constraint value storage element 2, among the divided circuits constituting the longest-delay-time combination and then calculates the constraint values of these divided circuits. More specifically, from all connection combinations of the divided circuits, that is, (divided circuit 111–divided circuit 112), (divided circuit 111–divided circuit 114), (divided circuit 113–divided circuit 112), and (divided circuit 113–divided circuit 114), the divided constraint value generation element 80 selects the combination (divided circuit 113–divided circuit 114) as the longest-delay-time combination. The divided constraint value generation element 80 calculates the delay time ratio (divided circuit 113:divided circuit 114=1:1) of the divided circuits (divided circuit 113–divided circuit 114) stored in the divided circuit storage element 7 and shown in FIG. 3. From the constraint value of 10 nanoseconds stored in the optimization constraint value storage element 2, the divided constraint value generation element 80 generates the constraint value of 5.0 nanoseconds for the divided circuit 113 and the constraint value of 5.0 nanoseconds for the divided circuit 114 according to the delay time ratio, and stores the calculated values in the divided constraint value storage element 9.

Figure 9:
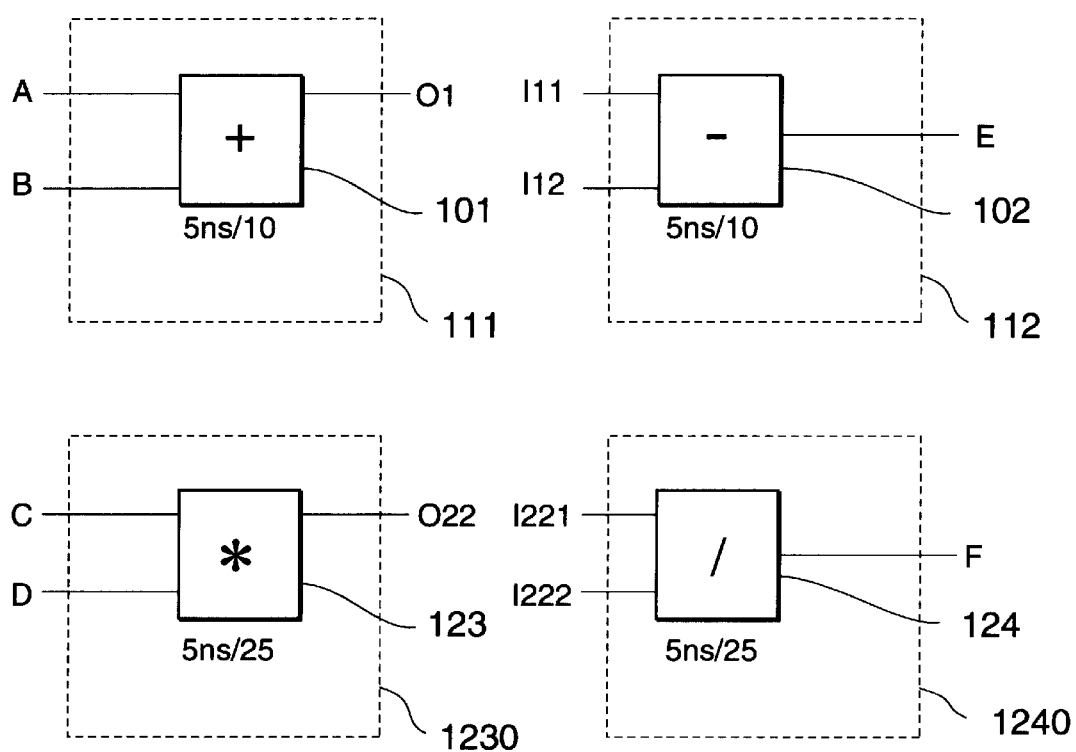
FIG. 9 is a diagram showing divided circuits 111, 112, 1230, and 1240.

The divided circuit optimization element 10 performs logic optimization, in parallel, for the divided circuit 113 and the divided circuit 114 stored in the divided circuit storage element 7 using the constraint values (5.0 nanoseconds for divided circuit 113) and (5.0 nanoseconds for divided circuit 114) stored in the divided constraint value storage element 9. The element then stores the optimized divided circuits 1230 and 1240 and non-optimized divided circuits 111 and 112, shown in FIG. 9, in the divided circuit optimization result storage element 11.

Figure 10:
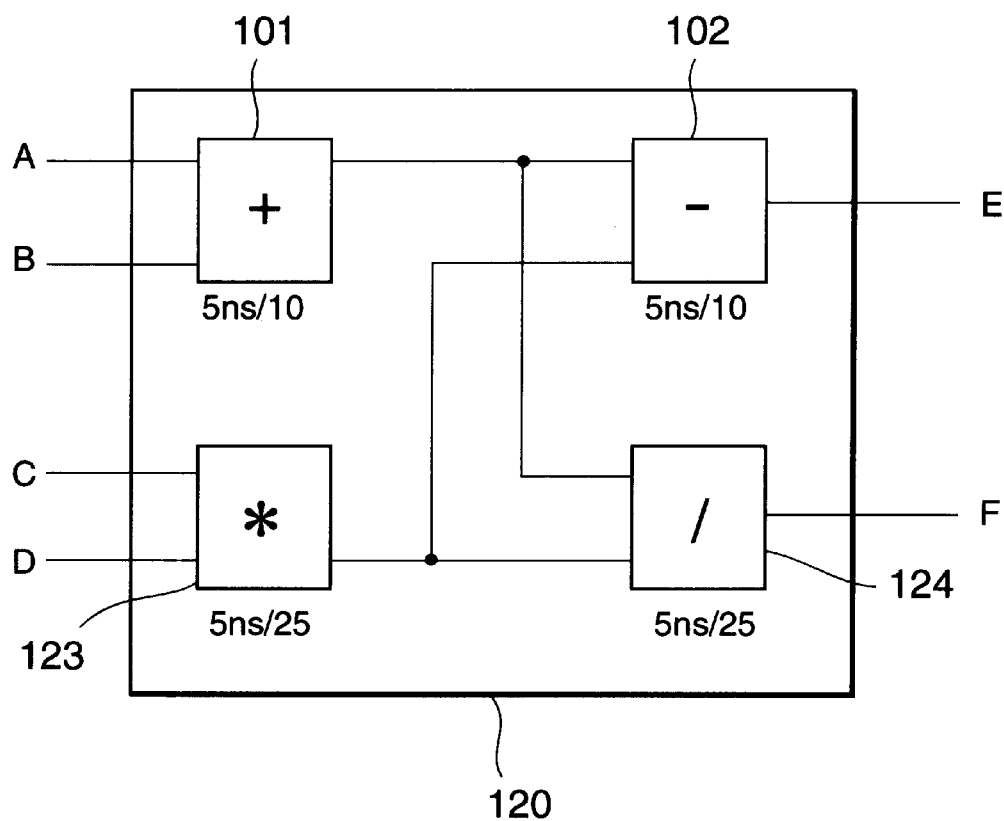
FIG. 10 is a diagram showing a logic circuit 120.

The divided circuit merge element 12 references the divided circuit optimization result storage element 11 to get information on the input/output terminals. The terminals are the output signal terminal O1 of the divided circuit 111, the input signal terminals I11 and I12 of the divided circuit 112, the output signal terminal O22 of the divided circuit 1230, and the input signal terminals I221 and I222 of the divided circuit 1240. Then, the divided circuit merge element 12 connects the output signal terminal O1 of the divided circuit 111 to the input signal terminal I11 of the divided circuit 112 and to the input signal terminal I221 of the divided circuit 1240 and connects the output signal terminal O22 of the divided circuit 1230 to the input signal terminal I12 of the divided circuit 112 and to the input signal terminal I222 of the divided circuit 1240 to generate one logic circuit 120. FIG. 10 shows the generated logic circuit 120. The divided circuit merge element 12 stores the logic circuit 120 into the divided circuit merge result storage element 13.

Next, the operation of the embodiment will be described.

Figure 11:
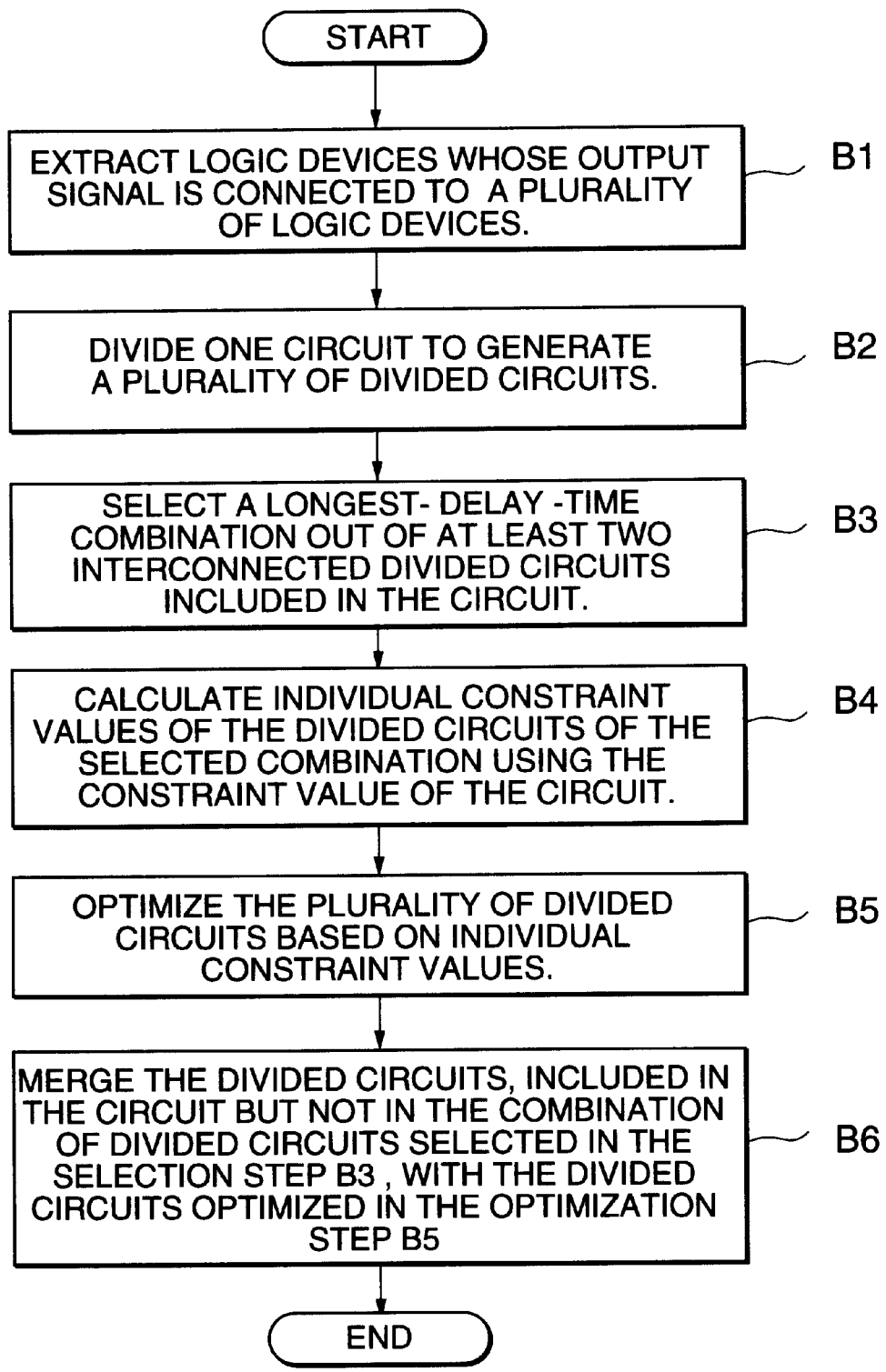
FIG. 11 is a flowchart showing the second embodiment of the present invention.

Referring to FIGS. 8 and 11, the multiple-output-device extraction element 4 uses the circuit information on the logic circuit 100, stored in the logic circuit storage element 1, to extract the logic devices, whose output signal is sent to a plurality of logic devices, from the logic circuit 100 (step B1).

The logic circuit dividing element 6 divides one circuit into a plurality of divided circuits (step B2).

The divided constraint value generation element 80 selects the longest-delay-time combination from the combinations of at least two interconnected divided circuits included in the circuit (step B3).

The divided constraint value generation element 80 calculates the constraint value of each divided circuit of the selected combination of the divided circuits using the constraint value of the circuit (step B4).

The divided circuit optimization element 10 optimizes the divided circuits, for which the constraint values have been calculated, using the constraint values (step B5).

The divided circuit merge element 12 merges the divided circuits included in the circuit but not selected in the selection step with the divided circuits optimized in the optimization step into one circuit (step B6).

In this embodiment, there is provided the divided constraint value generation element 80 that selects the longest-delay-time combination of at least two interconnected divided circuits included in the logic circuit 100 and calculates the constraint value of each of the divided circuits 1230 and 1240 constituting the selected combination. In this embodiment, only the divided circuits 1230 and 1240, for which the constraint values have been calculated by the divided constraint value generation element 80, are optimized based on the constraint values. Therefore, the embodiment reduces the number of divided circuits to be optimized. Another advantage of the embodiment is a reduction in processing time.

As described above, the apparatus according to the present invention divides a circuit to be optimized into a plurality of divided circuits with the logic device output signals, which are connected to a plurality of logic devices, as cut points. After that, the apparatus performs logic optimization, in parallel, for each of divided circuits. Thus, automatically changing the optimization of a circuit to the optimization of a plurality of divided circuits and optimizing the plurality of divided circuits in parallel speeds up the optimization of the whole circuit.

In addition, the present invention provides an element that selects the longest-delay-time combination of at least two interconnected divided circuits included in a logic circuit and calculates the constraint value of each of the divided circuits constituting the selected combination. The apparatus according to the present invention optimizes only the divided circuits, for which the constraint values have been calculated by this element, based on the constraint values. Therefore, the present invention reduces the number of divided circuits to be optimized. Another advantage of the present invention is a reduction in processing time.

While this invention has been described in conjunction with the preferred embodiments described above, it will now be possible for those skilled in the art to put this invention into practice in various other manners.

What is claimed is:

1. A circuit design apparatus comprising:
    a first element which divides a circuit into a plurality of divided circuits by using an output signal of a logic device included in said circuit as a cut point;
    a second element which calculates individual constraint values of said divided circuits, respectively, using a constraint value of said circuit;
    a third element which optimizes each of said divided circuits based on the corresponding individual constraint values; and
    a fourth element which merges said divided circuits, which are optimized by said third element, into one circuit.

2. The circuit design apparatus as claimed in claim 1, wherein said first element comprises:
    an extraction element which extracts a logic device whose output signal is connected to a plurality of logic devices; and
    a decision element which decides, as a cut point, the output signal of the logic device extracted by said extraction element.

3. The circuit design apparatus as claimed in claim 1, wherein said constraint value is a delay limit time.

4. The circuit design apparatus as claimed in claim 1, wherein said second element calculates said individual constraint values of said divided circuits from connection relations between said divided circuits.

5. The circuit design apparatus as claimed in claim 1, wherein said divided circuits include a first and a second divided circuits,
    wherein said first divided circuit has a first delay time,
    wherein said second divided circuit is connected to an output of said first divided circuit and has a second delay time, and
    wherein said second element calculates the individual constraint values of said first and second divided circuits based on a delay time ratio between said first and second delay times.

6. The circuit design apparatus as claimed in claim 5, wherein said second element proportionally distributes said constraint value of said circuit using said delay time ratio between said first and second delay times to calculate said individual constraint values of said first and second divided circuits.

7. The circuit design apparatus as claimed in claim 1, wherein said divided circuits include a first divided circuit, a second divided circuit, a third divided circuit which receives output signals from said first and second divided circuits, and a fourth divided circuit which receives the output signals from said first and second divided circuits,
    wherein said second element calculates the individual constraint values of said first and third divided circuits, respectively, from a relation between said first divided circuit and said third divided circuit;
    wherein said second element calculates the individual constraint values of said second and third divided circuits, respectively, from a relation between said second divided circuit and said third divided circuit;
    wherein said second element calculates the individual constraint values of said first and fourth divided circuits, respectively, from a relation between said first divided circuit and said fourth divided circuit;
    wherein said second element calculates the individual constraint values of said second and fourth divided circuits, respectively, from a relation between said second divided circuit and said fourth divided circuit; and
    wherein, for each of said first to fourth divided circuits, said second element generates a rigorous constraint value out of a plurality of individual constraint values for each divided circuit as the individual constraint value of said divided circuit.

8. The circuit design apparatus as claimed in claim 1, further comprising a fifth element which checks whether or not said divided circuits generated by said first element each satisfy a predetermined limit.

9. The circuit design apparatus as claimed in claim 1, wherein the logic device is connected to a plurality of logic devices in said circuit.

10. The circuit design apparatus as claimed in claim 1, wherein the logic device is serially connected to a plurality of logic devices in said circuit.

11. A circuit design apparatus comprising:
    a first element which generates a plurality of divided circuits from a circuit;
    a second element which selects a longest-delay-time combination out of combinations each composing of interconnected divided circuits included in said circuit, and calculates individual constraint values of the divided circuits of the selected combination using a constraint value of said circuit;
    a third element which optimizes said divided circuits, for which the constraint values are calculated by said second element, based on the individual constraint values; and
    a fourth element which merges the divided circuits optimized by said third element with the divided circuits generated by said first element but not included in the combination selected by said second element to generate one circuit.

12. The circuit design apparatus as claimed in claim 11, wherein said divided circuits include a first divided circuit, a second divided circuit, a third divided circuit which receives output signals from said first and second divided circuits, and a fourth divided circuit which receives the output signals from said first and second divided circuits,
    wherein said second element selects a combination of said first and said third divided circuits and calculates the individual constraint values of said first and third divided circuits, respectively, from a relation between said first divided circuit and said third divided circuit;

wherein said third element optimizes said first and third divided circuits; and wherein said fourth element merges said first and third divided circuits optimized by said third element with said second and fourth divided circuits.

13. The circuit design apparatus as claimed in claim 11, wherein said first element generates a plurality of divided circuits by using an output signal of a logic device in said circuit as a cut point.

14. The circuit design apparatus as claimed in claim 13, wherein the logic device is connected to a plurality of logic devices in said circuit.

15. A circuit design method comprising:

dividing a circuit into a plurality of divided circuits by using an output signal of a logic device included in said circuit as a cut point;

calculating individual constraint values of said divided circuits, respectively, using a constraint value of said circuit;

optimizing each of said divided circuits based on the corresponding individual constraint values; and merging said divided circuits, which are optimized during said optimizing step, into one circuit.

16. The circuit design method as claimed in claim 15, wherein a logic device whose output signal is connected to a plurality of logic devices is extracted and the output signal from the extracted logic device is decided as a cut point during said dividing step.

17. The circuit design method as claimed in claim 15, wherein said constraint value and said individual constraint values are a delay limit time.

18. The circuit design method as claimed in claim 15, wherein said individual constraint values of said divided circuits are calculated from connection relations between said divided circuits during said calculating step.

19. The circuit design method as claimed in claim 15, wherein a first divided circuit having a first delay time and a second divided circuit, which is connected to an output of said first divided circuit and has a second delay time, are generated during said dividing step, and wherein the individual constraint values of said first and second divided circuits are calculated based on a delay time ratio between said first and second delay times during said calculating step.

20. The circuit design method as claimed in claim 19, wherein said constraint value of said circuit are proportionally distributed using the delay time ratio between said first and second delay times to calculate said individual constraint values of said first and second divided circuits during said calculating step.

21. The circuit design method as claimed in claim 15, wherein a first divided circuit, a second divided circuit, a third divided circuit which receives output signals from said first and second divided circuits, and a fourth divided circuit which receives the output signals from said first and second divided circuits are generated during said dividing step, wherein the individual constraint values of said first and third divided circuits are calculated, respectively, from a relation between said first divided circuit and said third divided circuit, the individual constraint values of said second and third divided circuits are calculated, respectively, from a relation between said second divided circuit and said third divided circuit, the individual constraint values of said first and fourth divided circuits are calculated, respectively, from a relation between said first divided circuit and said fourth divided circuit, the individual constraint values of said second and fourth divided circuits are calculated, respectively, from a relation between said second divided circuit and said fourth divided circuit, and for each of the first to fourth divided circuits, a rigorous constraint value is generated from the plurality of individual constraint values as the individual constraint value during said calculating step.

22. The circuit design method as claimed in claim 15, further comprising:

checking whether or not said divided circuits generated during said dividing step each satisfy a predetermined limit.

23. The circuit design method as claimed in claim 15, wherein the logic device is connected to a plurality of logic devices in said circuit.

24. The circuit design method as claimed in claim 15, wherein the logic device is serially connected to a plurality of logic devices in said circuit.

25. A circuit design method comprising:

generating a plurality of divided circuits from a circuit;

selecting a longest-delay-time combination out of combinations each composing of interconnected divided circuits included in said circuit;

calculating individual constraint values of the divided circuits of the selected combination using a constraint value of said circuit;

optimizing the divided circuits, for which the constraint values are calculated, based on said individual constraint values; and merging the divided circuits included in said circuit but not in the combination selected during said selecting step with the divided circuits optimized during said optimizing step to generate one circuit.

26. The circuit design method as claimed in claim 25, wherein said first element generates a plurality of divided circuits by using an output signal of a logic device in said circuit as a cut point.

27. The circuit design method as claimed in claim 26, wherein the logic device is connected to a plurality of logic devices in said circuit.

* * * * *